(12) United States Patent
Tanabe

(10) Patent No.: US 6,501,412 B2
(45) Date of Patent: Dec. 31, 2002

(54) ANALOG-TO-DIGITAL CONVERTER INCLUDING A SERIES OF QUANTIZERS INTERCONNECTED IN CASCADE

(75) Inventor: Shinji Tanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/996,930

(22) Filed: Nov. 30, 2001

(65) Prior Publication Data

US 2002/0167437 A1 Nov. 14, 2002

(30) Foreign Application Priority Data

May 9, 2001 (JP) ........................................ 2001-138305

(51) Int. Cl.[7] .............................................. H03M 1/38
(52) U.S. Cl. ....................................... 341/161; 341/162
(58) Field of Search ................................. 341/161, 162, 341/118, 120, 141, 156

(56) References Cited

U.S. PATENT DOCUMENTS 4,999,624 A * 3/1991 Pichlik ........................ 341/118

* cited by examiner

Primary Examiner—Peguy Jeanpierre
Assistant Examiner—Joseph J. Lauture
(74) Attorney, Agent, or Firm—Rabin & Berdo, P.C.

(57) ABSTRACT

Quantizers included in an analog-to-digital converter each compare an input analog voltage with a reference voltage to convert the analog voltage to digital data and output a voltage representative of a difference between the analog voltage and a voltage corresponding to the digital data. In each quantizer includes a comparator comparing the analog voltage with the reference voltage to output a result of comparison. An amplifier amplifies a voltage representative of a difference of the analog voltage from the reference voltage. Another amplifier inverts the voltage representative of the difference of the analog voltage from the reference voltage and amplifies the inverted voltage. A couple of switches are respectively connected to the one and the other amplifier for selecting either one of the output voltages of the amplifiers in accordance with the result of comparison. An exclusive-NOR gate develops the digital data in accordance with the result of comparison and digital data output from the preceding-stage quantizer.

15 Claims, 6 Drawing Sheets

ANALOG-TO-DIGITAL CONVERTER INCLUDING A SERIES OF QUANTIZERS INTERCONNECTED IN CASCADE

BACKGROUND OF THE INVENTION

1. Field of the Invention

The present invention relates to an analog-to-digital (AD) converter for converting an analog voltage to digital data.

2. Description of the Background Art

A conventional serial-parallel type of AD converter includes a plurality of parallel ADCs (Analog-to-Digital Converters). Specifically, an analog input signal is input to an M-bit ADC on the input terminal of the AD converter and converted to M bits of digital data by one of the parallel ADCs. A DAC (Digital-to-Analog Converter) included in the AD converter converts the digital data to a corresponding analog voltage. A differential circuit included in the AD converter produces a difference between the analog voltage produced by the DAC and the analog input voltage. An amplifier included in the AD converter amplifies the difference and feeds the amplified difference to an N-bit ADC, which is another of the parallel ADCs.

An N-bit shifter also included in the AD converter raises the digital data output from the M-bit ADC by N bit positions toward its most significant bit position. An adder also included in the AD converter adds both of the digital data output from the N-bit ADC and the N-bit shifter to each other to thereby output the (M+N) bits of digital data from the output terminal of the AD converter.

A problem with the conventional AD converter described above is that the DAC must convert the digital data to which the analog input voltage was converted to a further analog voltage, thus incurring some time delay in the entire AD conversion. Another problem is that the inclusion of the differential circuit and the amplifier, which handle the analog voltages, possibly aggravates errors. The conventional AD converter is therefore likely to cause the conversion to be delayed and deteriorate the accuracy in AD conversion.

SUMMARY OF THE INVENTION

It Is an object of the present invention to provide an AD converter in which the delay and errors are minimized in AD conversion.

In accordance with the present invention, an analog-to-digital conversion circuit includes a series of quantizers each for comparing an input analog voltage with a reference voltage to convert the analog voltage to digital data and outputting a voltage representative of a difference of the input voltage from a voltage corresponding to the digital data. Each quantizer includes a comparator for comparing the analog voltage with the reference voltage to output the result of comparison. A first amplifier amplifies a voltage representative of a difference of the analog voltage from the reference voltage. A second amplifier inverts the voltage representative of the difference of the analog voltage from the reference voltage and amplifies the inverted voltage. A first and a second switch are respectively connected to the first and second amplifiers for selecting either one of the output voltages of the first and second amplifiers in accordance with the result of comparison output from the comparator. A data output circuit develops and outputs the digital data in accordance with the result of comparison and digital data fed from the preceding quantizer.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

To better understand the present invention, brief reference will be made to a conventional AD converter, shown in FIG. 1. The conventional AD converter to be described has a plurality of parallel ADCs connected in series.

Figure 1:
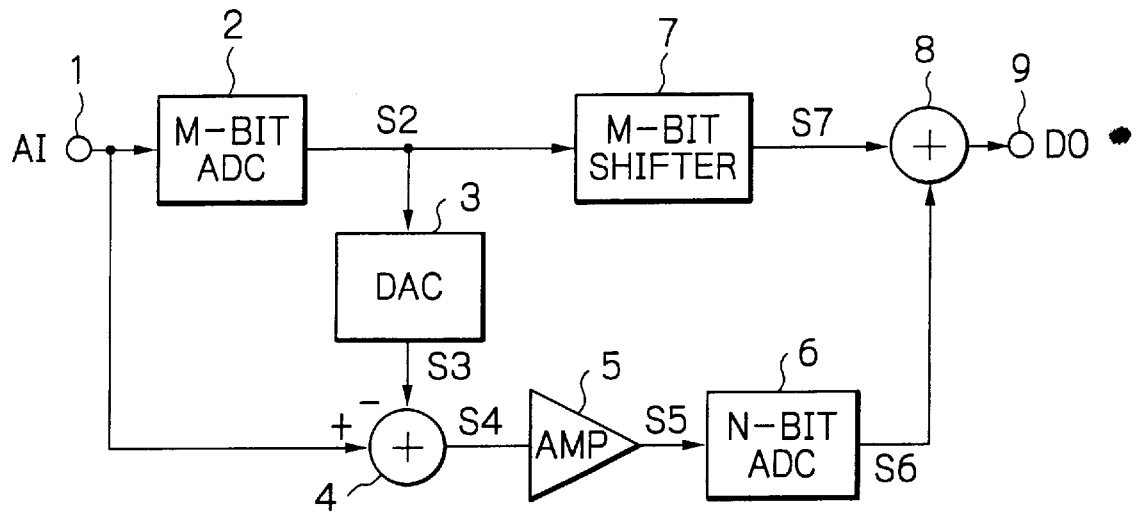
FIG. 1 is a schematic block diagram showing a conventional AD converter.

Specifically, as shown in FIG. 1, the AD converter includes an input terminal 1 to which an analog input signal AI is applied. The input terminal 1 is connected to an M-bit (M being "3" by way of example) ADC 2. The M-bit ADC 2 converts the analog input signal AI to corresponding M bits of digital data S2 with ($2^M$–1) voltage comparators although not shown specifically. The M-bit ADC 2 has the output S2 connected to a DAC 3 and an N-bit shifter 7. Connections are denoted with the reference numerals of signals appearing on the associated connections. The DAC 3 converts the digital data S2 to a corresponding analog voltage S3.

A differential circuit 4 receives the analog input signal AI and the analog voltage S3 at its non-inverting input (+) and inverting input (−), respectively. The differential circuit 4 outputs a voltage S4 representative of a difference between the input signal AI and the analog voltage S3. The voltage S4 is input to an amplifier (AMP) 5 and amplified by the factor of $2^M$ (eight times in this instance) thereby. The amplifier 5 feeds its amplified output S5 to an N-bit (N being "4" by way of example) ADC 6. The N-bit ADC 6 produces digital data S6 corresponding to the amplified voltage S5 to deliver the data S6 to one input terminal of an adder 8.

The M-bit ADC 2 has the output S2 connected to the N-bit shifter 7 as well as to the DAC 3, as described earlier. The N-bit shifter 7 raises the digital data S2 by N bit positions for thereby outputting resultant digital data S7 to the other input terminal of the adder 8. The adder 8 adds the digital data S6 and S7 to each other. The resulting the (M+N) bits of digital data DO is output from the adder 8 to an output terminal 9.

Figure 2:
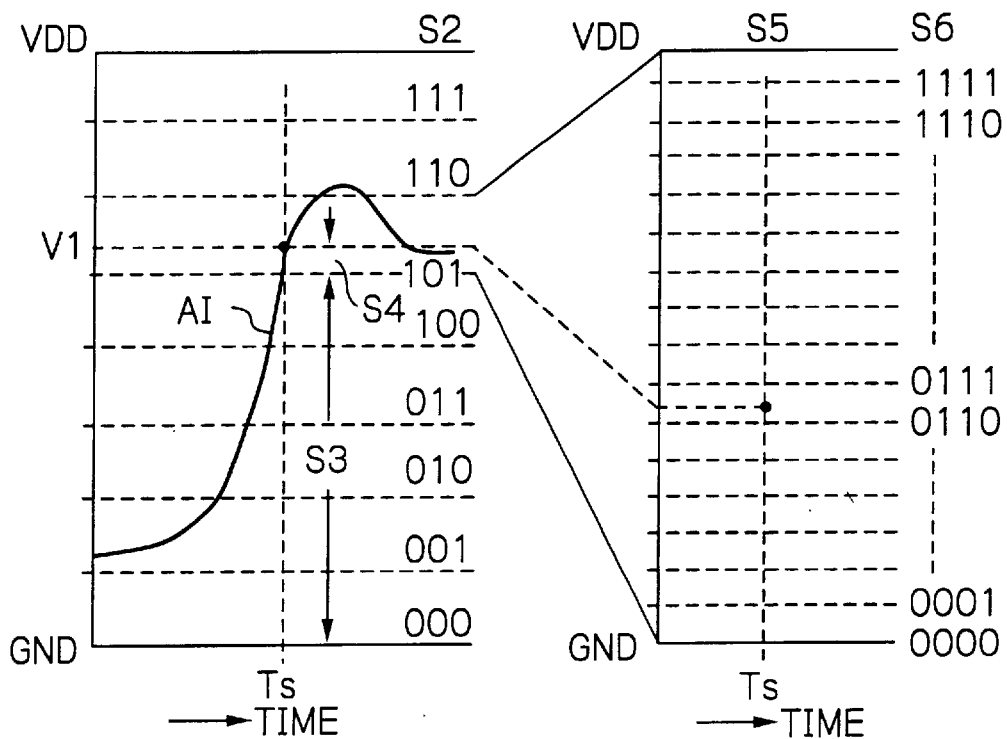
FIG. 2 is a timing chart useful for understanding a specific operation of the converter shown in FIG. 1.

The operation of the conventional AD converter will be described with reference to FIG. 2. As plotted, a specific, analog input voltage AI is input to the input terminal 1. Assume that at a sampling time Ts the input signal AI has a voltage V1 which falls between (5/8)VDD and (6/8)VDD where VDD denotes a source voltage with respect to the ground or reference level GND. Then, the M-bit ADC 2 outputs corresponding digital data S2 in the form of logical "101" and feeds it to the DAC 3. In response, the DAC 3 produces a corresponding analog voltage S3, which takes the (5/8)VDD, to be fed to the inverting input terminal (−) of the differential circuit 4.

The differential circuit 4 produces a voltage S4 representative of a difference, V1−(5/8)VDD, between the analog voltage S3 and the input voltage A1 which is applied to the non-inverting input terminal (+) of the circuit 4. The amplifier 5 multiplies the difference voltage S4 by the factor of $2^M$ (eight in this example) and delivers the amplified voltage S5 to the N-bit ADC 6. The N-bit ADC 6 converts the analog voltage S5 to, in this instance, the four bits of digital data S6, e.g., "0110", which is in turn fed to the adder 8.

The digital data S2 out put from the M-bit ADC 2 is applied to the N-bit shifter 7 as well as to the DAC 3. The N-bit shifter 7 raises the digital data S2 by four bit positions and thereby outputs digital data S7 of "1010000" in this example. The adder 8 adds the digital data S6 and S7 to each other to thereby output the seven bits of digital signal DO of "1010110".

As stated above, in the serial-parallel AD converter, the M-bit ADC 2 roughly determines the more significant bits of digital data S2 first. Subsequently, the N-bit ADC 6 produces the less significant bits of digital data S6 from the difference voltage S4. The M-bit ADC 2 and N-bit ADC6 therefore respectively need seven voltage comparators and fifteen voltage comparators, i.e., twenty-two voltage comparators in total. By contrast, an AD converter of the type executing seven-bit, parallel bulk conversion corresponding to the serial-parallel AD converter needs $2^7-1=127$ voltage comparators in total. The serial-parallel AD converter can therefore execute AD conversion at relatively higher speed with a smaller number of voltage comparators than the seven-bit, parallel bulk conversion type of circuit. The conventional serial-parallel AD converter, however, has some problems discussed earlier.

Figure 3:
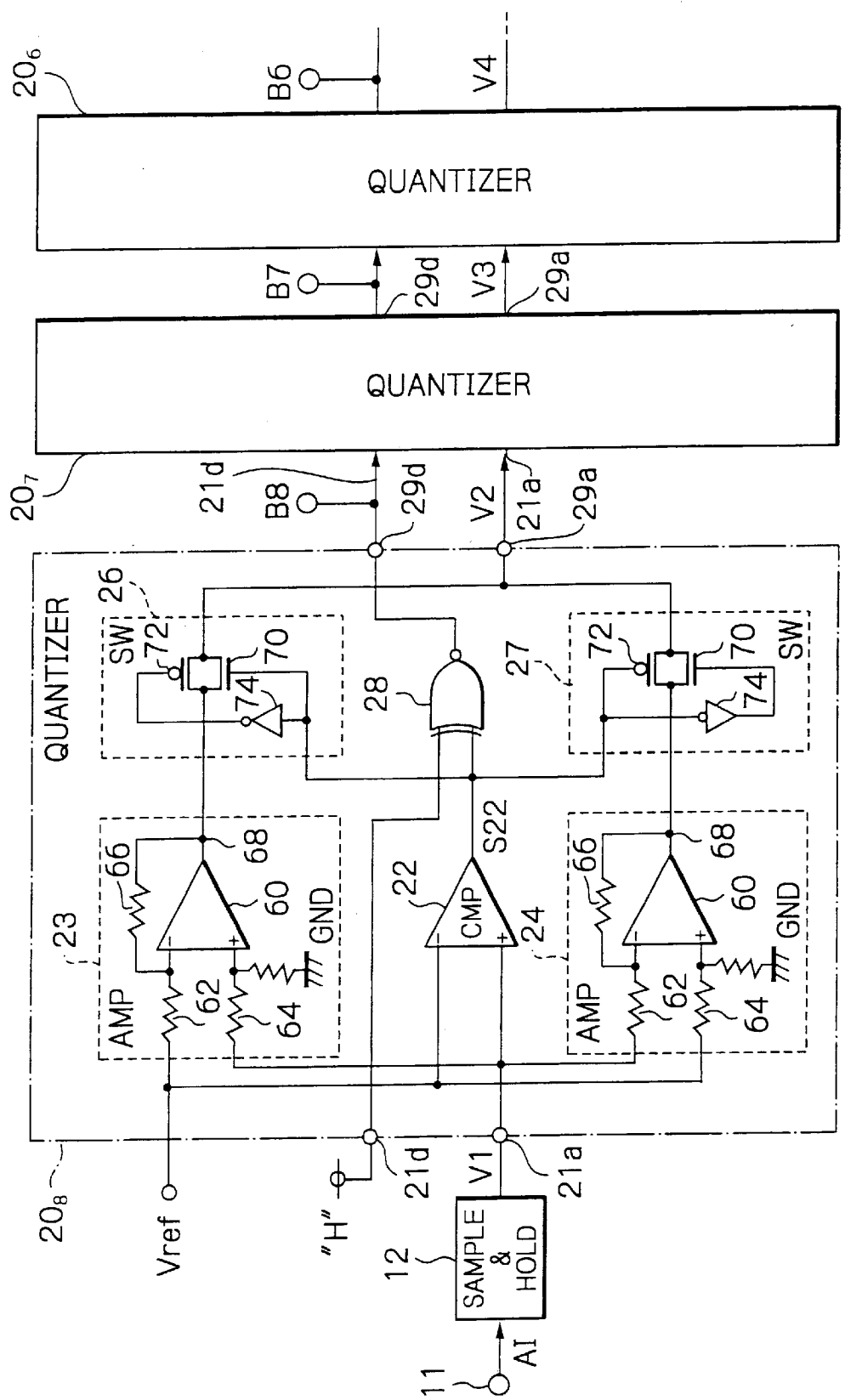
FIG. 3 is a schematic block diagram showing a preferred embodiment of an AD converter in accordance with the present invention.

Referring to FIG. 3, an embodiment of the AD converter in accordance with the present invention will be described. Briefly, the illustrative embodiment includes n, which is a natural number, e.g., eight one-bit quantizers connected in series for converting an analog input voltage to the n bits of digital data corresponding thereto.

As shown in FIG. 3, the AD converter includes an input terminal 11 to which an analog input voltage AI is applied. The input terminal 11 is connected to a sample and hold circuit 12. The sample and hold circuit 12 is adapted to hold and sample the input voltage A1 to output the voltage V of the input signal AI in synchronism with a clock signal, not shown, input thereto. The sample and hold circuit 12 is connected to a series of eight one-bit quantizers $20_8$, $20_7$, ..., $20_1$, interconnected in cascade. In the figure, only quantizers $20_8$, $20_7$ and $20_6$ are shown for simplicity. Because the quantizers $20_8$ through $20_1$ are identical in configuration, the following description will concentrate on the quantizer $20_8$ located at the first stage by way of example.

The quantizer $20_8$ includes input terminals 21a and 21d to which in general an analog voltage and the result of quantization are respectively input from the preceding stage. Specifically in the first stage, the input terminal 21a is connected to the output terminal of the sample and hold circuit 12 while the input terminal 21d is connected to a source voltage VDD, not shown, and held at a high level (H).

Further, the input terminal 21a is connected to the non-inverting input (+) of a voltage comparator 22, the non-inverting input (+) of a first differential amplifier (AMP) 23, and the inverting input (+) of a second differential amplifier 24. It is to be noted that the voltage comparator (CMP) 22 and differential amplifiers 23 and 24 are typical examples of comparing means and amplifying means, respectively. A reference voltage Vref is applied to the inverting input (−) of the voltage comparator 22, the inverting input (−) of the differential amplifier 23 and the non-inverting input (+) of the differential amplifier 24. The reference voltage Vref is produced by halving the source voltage VDD.

The voltage comparator 22 is adapted to compare the voltages respectively input to its non-inverting input (+) and inverting input (−). If the voltage on the non-inverting input (+) is higher than the voltage on the inverting input (−), then the voltage comparator 22 causes its output signal S22 to go its high level (H). If the voltage on the non-inverting input terminal (+) is lower than the voltage on the inverting input (−), then the voltage comparator 22 causes the output signal S22 to go its low level (L).

Each of the differential amplifiers 23 and 24, which may be the same in structure as each other, is made up of an operation amplifier 60, input resistors 62 and 64, and a feedback resistor 66, which are interconnected as illustrated. The differential amplifiers 23 and 24 are adapted to double a difference between the voltages appearing on the non-inverting input (+) and inverting input (−) thereof and output the doubled difference on the output ports 68 thereof.

More specifically with respect to the first stage $20_8$, the differential amplifier 23 directly doubles a difference between the voltage applied to its non-inverting input (+), i.e., the voltage V1 appearing on the input terminal 21a and the reference voltage Vref applied to its inverting input (−). The other differential amplifier 24 inverts a difference between the voltage applied to its inverting input (−), i. e., the voltage V1 appearing on the input terminal 21a and the reference voltage Vref applied to its non-inverting input terminal (+). The differential amplifier 24 then doubles the inverted difference.

The differential amplifiers 23 and 24 have the output ports 68 thereof respectively connected to a first and a second analog switch (SW) 26 and 27, which have the output ports thereof connected in common to an analog output terminal 29a for developing an analog level. The analog switches 26 and 27 function as transfer gates, each of which includes MOS (Metal Oxide Semiconductor) transistors 70 and 72. The MOS transistors 70 and 72 have the control gate electrodes connected as shown in common to the output port S22 of the voltage comparator 22 to be ON/OFF controlled in response to the output signal S22. More specifically, the analog switches 26 and 27 are so configured to include an inverter 74 connected as shown in the figure that the switch 26 turns off when the signal S22 is in its high level "H" or turns on when it is in its low level "L", and, conversely, the analog switch 27 turns on when the signal S22 is in its low level "L" or turns off when it is in its high level "H". The analog switches 26 and 27 may be rendered alternatively, or complimentarily to each other, conductive in response to the result of comparison S22 made by the comparator 22.

The input terminal 21d is connected to one input of a data output circuit such as an exclusive-NOR (ENOR) gate 28. The signal S22 output from the voltage comparator 22 is also input to the other input of the ENOR gate 28. The ENOR gate 28 has its output port connected to an output terminal 29d for outputting digital data, which is the result from the quantization performed by the quantizer $20_8$.

The ENOR gate 28 is adapted to output its high level "H" when both of its input signals have the same logical level or output its low level "L" when they are different in logical level from each other. Therefore, if the signal applied to the input terminal 21d is in its high level "H" as is the case with the first stage $20_8$, the signal S22 is then directly transferred to the output terminal 29d; if otherwise, the signal S22 is inverted in logical level and then applied to the output terminal 29d.

The digital output terminal 29d and the analog output terminal 29a of the quantizer $20_8$ are respectively connected to the input terminals 21d and 21a of the second-stage quantizer $20_7$ that follows the first-state quantizer $20_8$. Further, a bit of digital data B8, developed from the ENOR 28 gate of the first stage $20_8$, is output from the output terminal 29d to form the most significant bit of target output digital data.

Similarly, the second stage $20_7$ has its analog and digital input ports 21a and 21d interconnected to the analog and digital output ports 29a and 29d, respectively of the first stage $20_8$. The third stage $20_6$ has its analog and digital input ports 21a and 21d interconnected to the analog and digital output ports 29a and 29d, respectively, of the second stage $20_7$. The fourth stages $20_5$ et seq., not shown, are similarly interconnected in cascade to the associated preceding stages thereof until the eighth stage $20_1$, not shown. Thus, the eight stages $20_8$ through $20_1$ develop the analog voltages V2 through V9 and digital voltages B8 through B1, respectively. The analog output V9 from the eighth stage $20_1$ is not significantly used.

Figure 4:
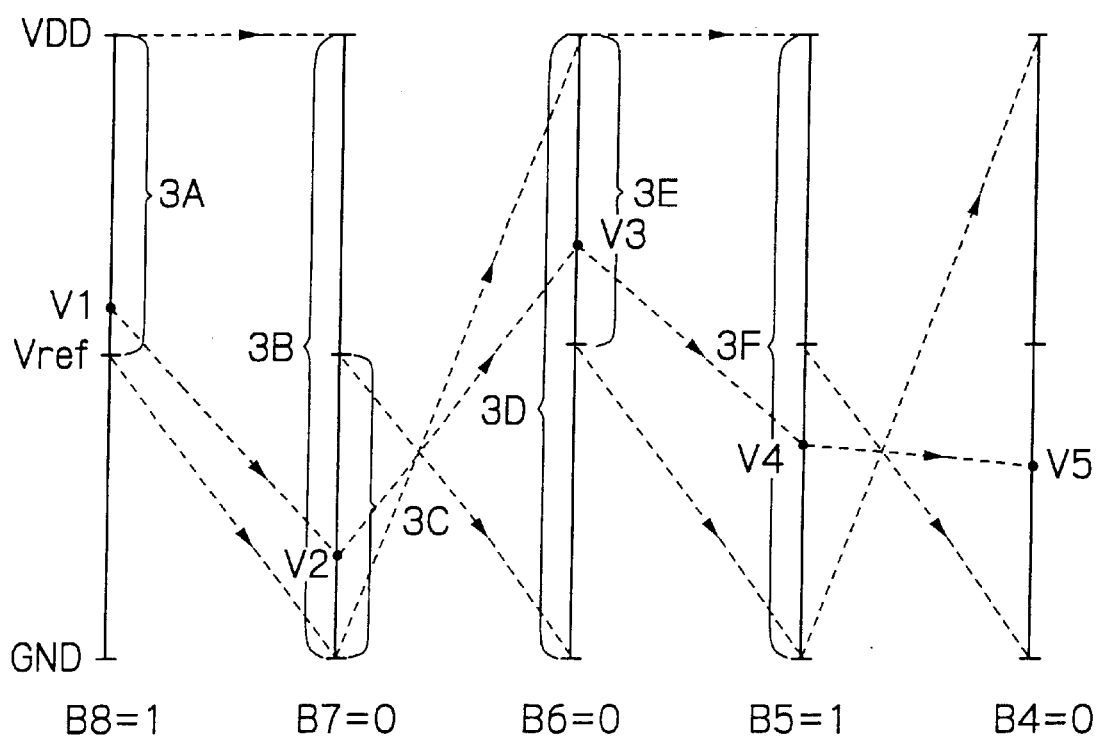
FIG. 4 is a timing chart useful for understanding a specific operation of the embodiment shown in FIG. 3.

A specific operation of the illustrative embodiment will be described with reference to FIG. 4. The sample and hold circuit 12 samples and holds the analog input signal AI in synchronism with the clock signal, not shown, while feeding the sampled signal V1 to the input terminal 21a of the quantizer $20_8$. As shown in FIG. 4, if the voltage V1 applied to the input terminal 21a of the quantizer $20_8$ lies in a range 3A expanding between the reference voltage Vref (=(1/2) VDD) and the source voltage VDD, then the voltage comparator 22 of the quantizer $20_8$ renders its output signal S22 to its high level "H".

On the other hand, the signal applied to the input terminal 21d of the first-stage quantizer $20_8$ is fixedly held in the high level "H". Therefore, the output signal of the ENOR gate 28 goes high in this instance. Consequently, the digital data B8 output from the output terminal 29d goes to its high level "H", which is representative of the most significant bit "1" of the target digital data.

The high-level signal 22 output from the voltage comparator 22 turns on the analog switch 26 and turns off the analog switch 27. The differential amplifier 23 doubles the difference voltage between the non-inverting and inverting input ports (+) and (−). That means that the range 3A expands to a range 3B expanding between the ground potential GND and the source voltage VDD, FIG. 4. The differential amplifier 23 doubles a voltage equal to the difference V1−Vref between the non-inverting input (+) and the inverting input (−) of the differential amplifier 23 to develop the voltage on its output port 68. The voltage thus doubled is then fed through the switch 26 now turned on to the output terminal 29a as a voltage V2. The voltage V2 is in turn applied to the input terminal 21a of the second-stage quantizer $20_7$.

If the voltage V2 applied to the input terminal 21a of the second-stage quantizer $20_7$ lies in a range 3C between the reference voltage Vref and the ground potential GND, FIG. 4, then the voltage comparator 22 of the quantizer $20_7$ causes its output signal S22 to go low. On the other hand, the logical high-level signal output from the quantizer $20_8$ is applied to the input terminal 21d of the quantizer $20_7$, causing the output signal of the ENOR gate 28 to go low. Consequently, the quantizer $20_7$ outputs digital data B7, which is a low level or "0", from the digital output terminal 29d. The digital data B7 will be the second most significant bit of the target digital data.

Further, the low-level signal S22 turns on the analog switch 27 and turns off the analog switch 26 in this example. The differential amplifier 23 inverts and doubles the range 3C to a range 3D expanding between the source voltage VDD to the ground potential GND, similarly to the above discussion except for the inversion. This means that the difference V1−Vref between the voltages on the non-inverting input (+) and inverting input (+) of the differential amplifier 24 is inverted and doubled. The inverted and doubled difference voltage is developed from the output port 68 of the amplifier 24 to the switch 27 now turned on as a voltage V3. The voltage V3 there fore appears on the output terminal 29a of the second-stage quantizer $20_7$, and is fed to the analog input terminal 21a of the third-stage quantizer $20_6$ following the second-stage quantizer $20_7$.

When the voltage V3 applied to the input terminal 21a of the third-stage quantizer $20_6$ lies in a range 3E extending between the reference voltage Vref and the source voltage VDD, the voltage comparator 22 of the quantizer $20_6$ causes its output S22 to go high. On the other hand, the low-level output of the quantizer $20_7$ is applied to the input terminal 21d of the quantizer $20_6$, causing the output signal of the ENOR 28 to go low. Consequently, digital data B6, which is its low level or "0", appears on the digital output terminal 29d of the third-stage quantizer $20_6$. The digital data B6 will form the third most significant bit of the target digital data.

The high-level signal S22 turns on the analog switch 26 and turns off the analog switch 27 of the third-stage quantizer $20_6$. The differential amplifier 23 doubles the range 3E to a range 3F expanding between the ground potential GND and the source voltage VDD, similarly to the above discussion. Consequently, the difference V1−Vref between the voltages on the non-inverting input (+) and inverting input (−) of the differential amplifier 23 is doubled and then applied to the output terminal 29a as a voltage V4 through the switch 26 thus turned on. The voltage V4 is fed to the analog input terminal 21a of the fourth-stage quantizer $20_5$ although not shown specifically.

The other quantizers $20_5$ through $20_1$ connected in series also produce quantized digital data B5 through B1, respectively, on their digital output terminals 29d although not shown specifically. The digital data B5 through B1 will form the least significant, five bits of the target digital data.

As stated above, in the illustrative embodiment, the voltage comparator 22 and two differential amplifiers 23 and 24 included in each of the quantizer $20_8$ through $20_1$ operate at the same time. In each of the quantizer $20_8$ through $20_1$, either one of the outputs from the differential amplifiers 23 and 24 is alternatively selected by either of the switches 26 and 27 which is enabled in response to the output S22 of the voltage comparator 22 representative of the result of comparison. The illustrative embodiment therefore reduces the delay which would otherwise be encountered in AD conversion. This advantage is not achievable with the conventional AD converter of FIG. 1 which is adapted to enable the amplifier or differential amplifier 5 to start operating in response to the output of the differential circuit or voltage comparator 4.

An alternative embodiment of the present invention will be described with reference to FIG. 5. The circuit elements of the illustrative embodiment like those of the previous embodiment are designated by identical reference numerals and will not be described specifically in order to avoid redundancy.

Figure 5:
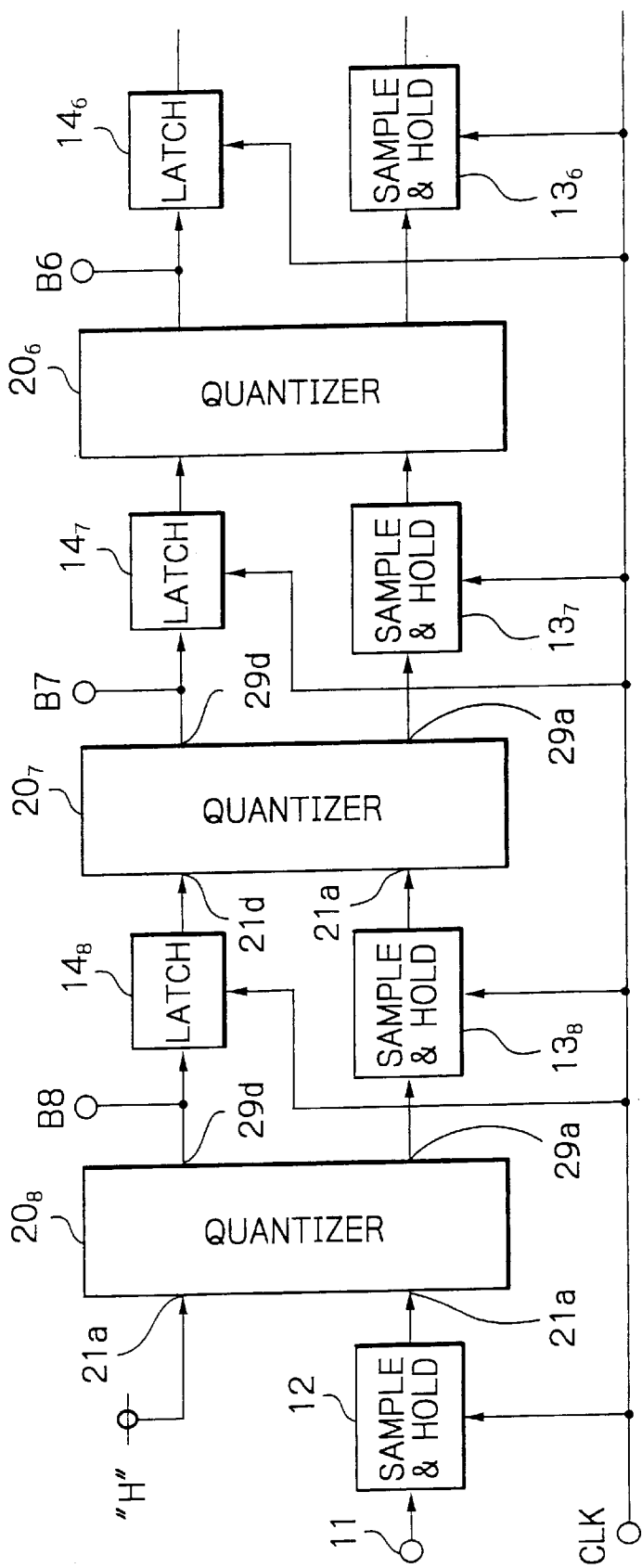
FIG. 5 is a schematic block diagram showing an alternative embodiment of the present invention.

As shown in FIG. 5, the AD converter additionally includes sample and hold circuits $13_8$ through $13_2$ (only $13_8$ through $13_6$ are shown for simplicity) and latches $14_8$ through $14_2$ (only $14_8$ through $14_6$ are shown). The sample and hold circuit $13_8$ and the latch $14_8$ are connected between the first-stage and the second-stage quantizers $20_8$ and $20_7$. More specifically, the sample and hold circuit $13_8$ is connected between the analog output terminal $29a$ of the first-stage quantizer $20_8$ and the analog input terminal $21a$ of the second-stage quantizer $20_7$. The latch $14_8$ is connected between the digital output $29d$ of the first-stage quantizer $20_8$ and the digital input $21d$ of the second-stage quantizer $20_7$. Likewise, the sample and hold circuit $13_7$ and the latch $14_7$, and the sample and hold circuit $13_6$ and the latch $14_6$ are respectively connected between the second-stage and the third-stage quantizers $20_7$ and $20_6$, and between the third-stage and the fourth-stage quantizers $20_6$ and $20_5$.

The remaining sample and hold circuits $13_5$ through $13_2$ and the remaining latches $14_5$ and $14_2$, not shown, are associated with the successive quantizers $20_5$ through $20_1$ in the same manner. The sample and hold circuits $13_8$ through $13_2$ as well as the sample and hold circuits 12 hold the analog voltages and digital data respectively fed thereto in timed with a clock signal CLK. Similarly, the latches $14_8$ through $14_2$ latch the digital data respectively fed thereto from the respective, preceding stages in timed with the clock signal CLK.

The illustrative embodiment, which includes the sample and hold circuits 13 and latches 14, allows the consecutive quantizers $20_8$ through $20_1$ to sequentially execute AD conversion in synchronism with the clock CLK in a so-called pipeline fashion. The illustrative embodiment therefore increases the operation speed when AD conversion is continuously executed, while achieving the same advantage as described in connection with the previous embodiment.

Figure 6:
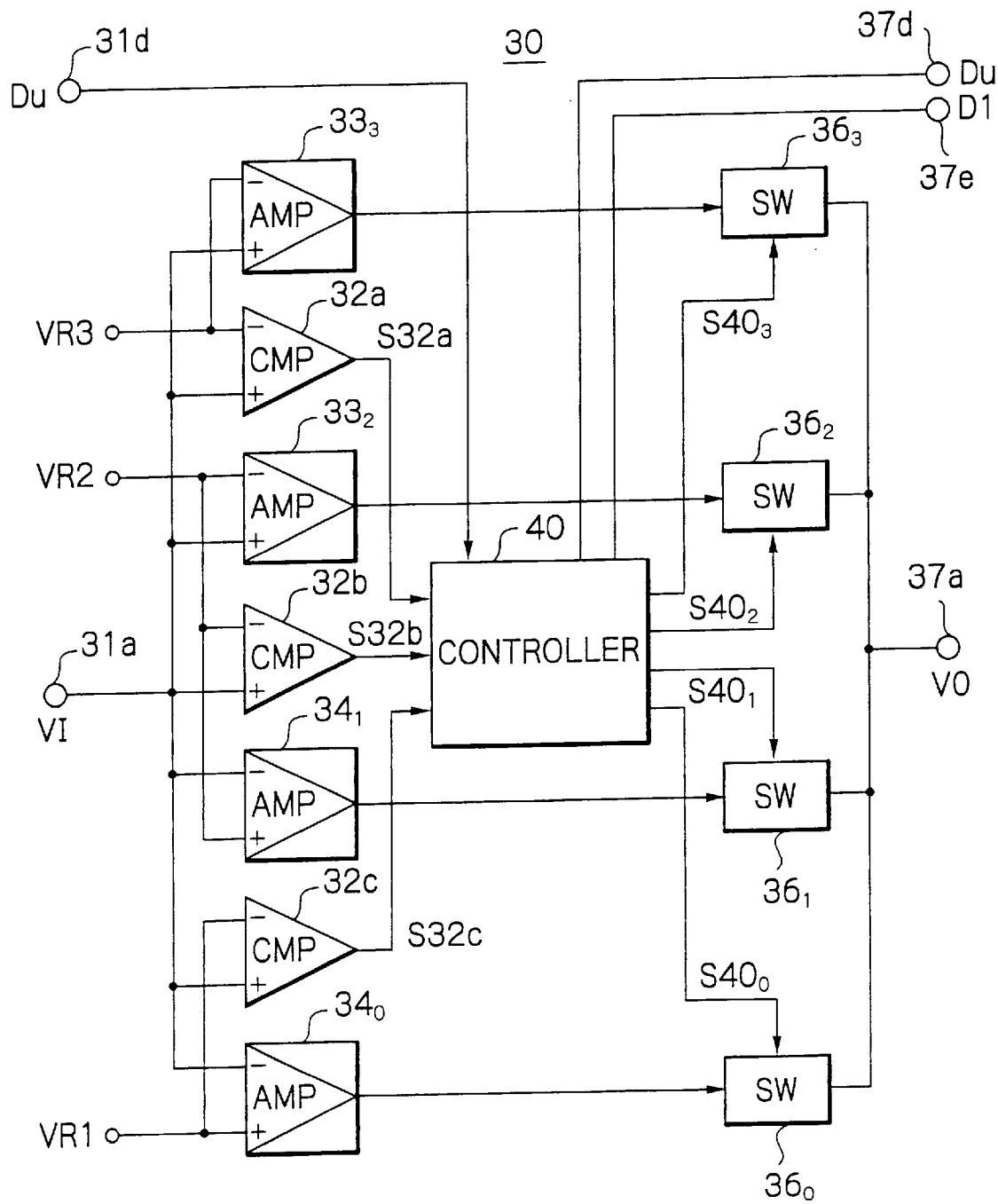
FIG. 6 is a schematic block diagram showing another alternative embodiment of the present invention.

FIG. 6 shows a two-bit parallel quantizer, generally 30, in accordance with another alternative embodiment of the present invention and substitutable for each of the quantizers $20_8$ through $20_1$, FIG. 3. Briefly, the quantizer is capable of generating two bits of digital data with three voltage comparators.

Specifically, the quantizer 30 includes analog and digital input terminals $31a$ and $31d$. The analog input voltage VI is applied to the analog input terminal $31a$ from either one of the sample and hold circuit 12 or the preceding, parallel quantizer 30. The more significant bit Du of digital data output from the preceding quantizer 30 is applied to the digital input terminal $31d$. The input terminal $31a$ is connected in common to the non-inverting inputs (+) of three voltage comparators $32a$, $32b$ and $32c$, the non-inverting inputs (+) of differential amplifiers $33_3$ and $33_2$, and the inverting inputs (−) of the differential amplifiers $34_1$ and $34_0$, as illustrated.

In the illustrative embodiment, the source voltage VDD is divided to one-fourth to form a reference voltage VR1, divided to two-fourths to form another reference voltage VR2, and divided to three-fourths to form a further reference voltage VR3. The reference voltage VR1 is applied to the inverting input (−) of the voltage comparator (CMP) $32c$ and the non-inverting input (+) of the differential amplifier $34_0$. The reference voltage VR2 is applied to the inverting input (−) of the differential amplifier $33_2$ and the non-inverting input (+) of the differential amplifier $34_1$. Further, the reference voltage VR3 is applied to the inverting input (−) of the voltage comparator $32a$ and the inverting input (−) of the differential amplifier $33_3$.

The voltage comparator $32a$ is adapted to compare the voltage applied to its non-inverting input (+) with the voltage applied to its inverting input (−) and produces its high-level "H" signal S$32a$ if the former is higher than the latter. This is also the case with the other voltage comparators $32b$ and $32c$ except that they output the high-level "H" signals S$32b$ and S$32c$. The signals S$32a$ through S$32c$ are input to a controller 40, which will be described specifically later.

Each of the differential amplifiers $33_3$ through $34_0$ is adapted to quadruple a difference between the voltages applies to its non-inverting input (+) and inverting input (−). More specifically, the differential amplifier $33_3$ whose non-inverting input (+) and inverting input (−) are connected to the input terminal $31a$ and reference voltage VR3, respectively, directly quadruples a difference between the input voltage VI and the reference voltage V3. The differential amplifier $33_2$ also directly quadruples a difference between the input voltage VI and the reference voltage V2.

On the other hand, the differential amplifier $34_1$ whose inverting input (−) and non-inverting input (+) are connected to the input terminal $31a$ and reference voltage VR2, respectively, inverts a difference between the input voltage VI and the reference voltage VR2 and then quadruples the difference. Likewise, the differential amplifier $34_0$ inverts and then quadruples a difference between the input voltage VI and the reference voltage VR1.

The differential amplifiers $33_3$, $33_2$, $34_1$ and $34_0$ have the outputs thereof respectively connected to analog switches $36_3$, $36_2$, $36_1$ and $36_0$, as illustrated, which are, in turn, connected in common to an analog output terminal $37a$. The controller 40 feeds a control signal S$40_3$ to the analog switch $36_3$ in order to selectively turn it on or off. Likewise, the controller 40 feeds control signals S$40_2$ through S$40_0$ to the analog switches $36_2$ through $32_0$, respectively. More specifically, the control signal S$40_3$ turns on the analog switch $36_3$ when in its high level "H" or turns it off when in its low level "L". This is also true with the other control signals S$40_2$ through S$40_0$ except that they are input to the analog switches $36_2$ through $36_0$, respectively.

Figure 7:
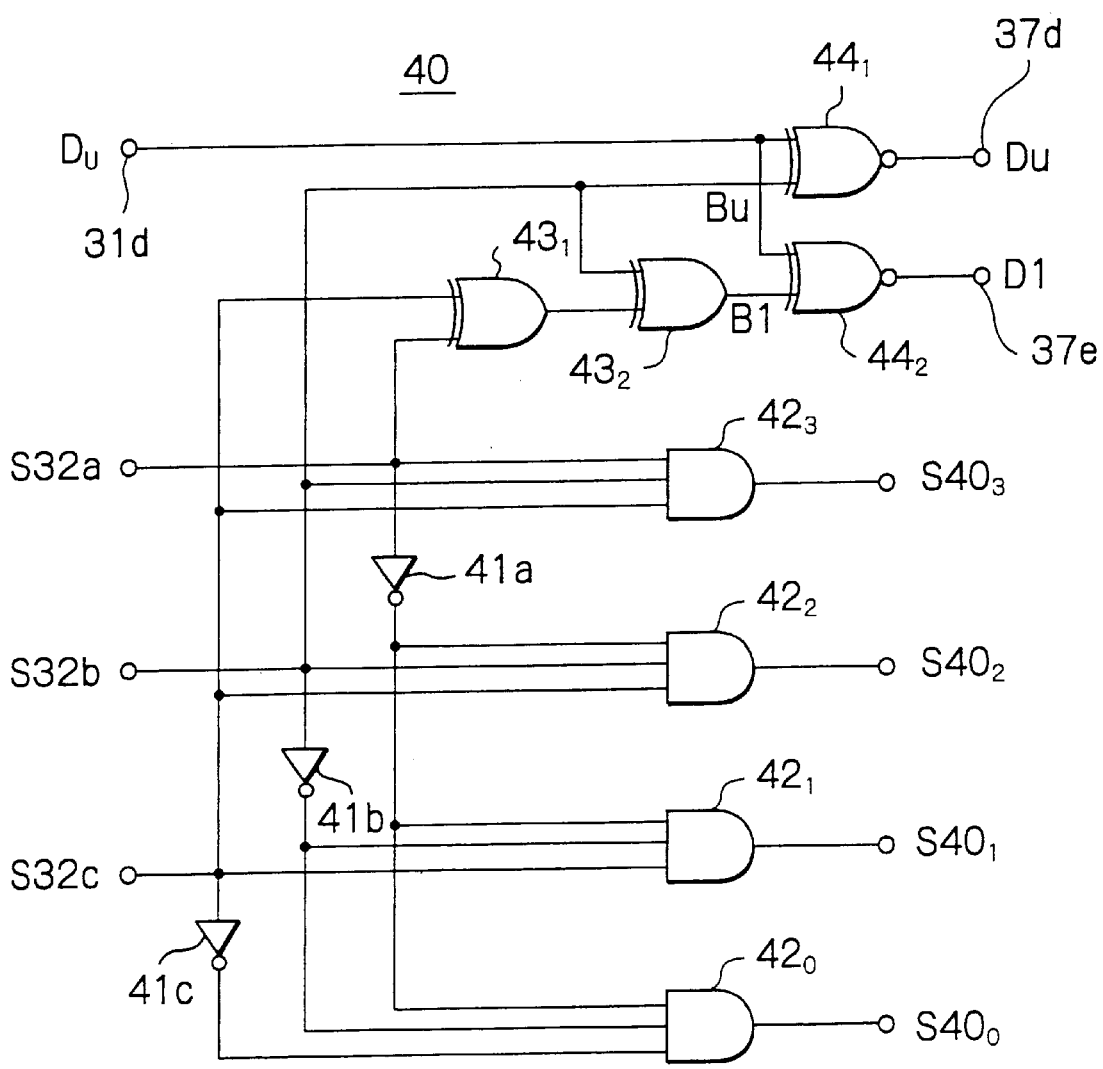
FIG. 7 is a schematic circuit diagram showing the specific circuitry of a controller included in the embodiment shown in FIG. 6.

A specific embodiment of the controller 40 will be described with reference to FIG. 7. As shown, the controller 40 is adapted to generate the control signals S$40_3$ through S$40_0$ in response to the signals S$32a$ through S$32c$ output from the voltage comparators $32a$ through $32c$, respectively, thereby turning on one of the analog switches $36_3$ through $36_0$ at a time. Further, the controller 40 generates two bits of digital data Du and Dl in accordance with the more significant bit provided from the preceding quantizer 30 and received by the input terminal $31d$ of the instant quantizer 30 and with the signals S$32a$ through S$32c$ output from the voltage comparators $32a$ through $32c$, respectively, of the instant quantizer 30.

More specifically, the controller 40 produces the control signals S$40_3$ through S$40_0$ from the signals S$32a$ through S$32c$ with logical circuitry made up of inverters $41a$, $41b$ and $41c$ and three-input AND gates $42_0$ through $42_3$.

The controller 40 additionally includes exclusive-OR (EOR) gates $43_1$ and $43_2$ connected in series for outputting two bits of data Bu and Bl in accordance with the signals S$32a$, S$32b$ and S$32c$. The two bits of data Bu and Bl are input to one input of ENOR gates $44_1$ and $44_2$, respectively.

The ENOR gates $44_1$ and $44_2$ have another input connected in common to receive the more significant bit of data Du from the preceding or upstream stage of quantizer 30. The ENOR gates $44_1$ and $44_2$ respectively correct the data Bu and Bl received by the one input thereof with the more significant bit of data Du thus input from the preceding stage, thereby producing two bits of digital data Du and D1, respectively to the following or downstream stage of quantizer 30.

The operation of the parallel quantizer 30 will be described with reference to FIG. 6 and also FIG. 7. When the input voltage VI applied to the input terminal 31a is lower than the reference voltage VR1, which is equal to (1/4)VDD, all the signals S32a, S32b and S32c output from the voltage comparators 32a, 32b and 32c, respectively, are rendered to the low level "L" thereof. As a result, the control signal $S40_0$ output from the AND gate $42_0$ goes high while the remaining control signals $S40_1$ through $S40_3$ output from the AND gates $42_1$ through $42_3$, respectively, go low. In response, the analog switch $36_0$ turns on and connects the output of the differential amplifier $34_0$ to the output terminal 37a while the remaining switches $36_1$, $36_2$ and $36_3$ are maintained disabled.

The differential amplifier $34_0$ quadruples a voltage (1/4)VDD−VI representative of a difference between the reference voltage VR1 and the input voltage VI. The input voltage VI is inverted and then amplified with respect to the other input voltage VR1. The resultant voltage is output as an analog output voltage VO via the switch $36_0$, now turned on, to the output terminal 37a and further to the downstream quantizer 30.

The EOR gates $43_1$ and $43_2$ generate two bits of data Bu and Bl, which represent binary "00", based on the signals S32a. S23b and S32c. The data Bu and Bl are applied to the one inputs of the ENOR gates $44_1$ and $44_2$, respectively. Therefore, if the more significant bit Du applied from the upstream equalizer 30 to the other inputs of the ENOR gates $44_1$ and $44_2$ is in its high level "H", then the bits of data Bu and Bl are directly fed out via the output terminals 37d and 37e as digital data Du and D1, representing binary "00", respectively. On the other hand, if the more significant bit Du of the preceding equalizer 30 takes its low level "L", then the data Bu and Bl are inverted by the ENOR gates $44_1$ and $44_2$, and then output from the output terminals 37d and 37e as digital data Du and D1, representative of binary "11", respectively. The bits of data Bu and Bl thus developed will be delivered to the following stage of quantizer 30.

When the input voltage VI applied to the input terminal 31a falls between the reference voltage VR2 (=(2/4)VDD) and the reference voltage VR3 (=(3/4)VDD), the signal 32a output from the voltage comparator 32a goes low while the signals S32b and S32c output from the voltage comparators 32b and 32c, respectively, go high. Consequently, the control signal $S40_2$ goes high to turn on the analog switch $36_2$ with the result that the output of the differential amplifier $33_2$ is connected to the output terminal 32a.

The differential amplifier $33_2$ quadruples a difference VI−(2/4)VDD between the input voltage VI and the reference voltage VR2. The input voltage VI is amplified without being inverted. The voltage produced from the differential amplifier $33_2$ is fed out via the switch $36_2$ thus turned on to the output terminal 37a as an output voltage VO.

Further, the EOR gates $43_1$ and $43_2$ respectively produce two bits of data Bu and Bl, representing binary "10", on the basis of the signals S32a, 32b and S32c and deliver the data Bu and Bl to the one inputs of the ENOR gates $44_1$ and $44_2$, respectively. The ENOR gates $44_1$ and $44_2$ correct the input data Bu and Bl, respectively, in accordance with the value of the more significant bit Du provided from the preceding stage of quantizer 30 and deliver the resulting digital data Du and D1 to the output terminals 37d and 37e, respectively.

As stated above, the parallel quantizer 30 is capable of quantizing a couple of bits in a single operation at the same time. The illustrative embodiment therefore halves the period of time required for AD conversion while achieving the advantage of the embodiment shown in FIG. 3 as well.

While the embodiments shown in FIGS. 3 and 6 have concentrated on a one-bit quantizer and a two-bit quantizer, respectively, such quantizers may be adapted to handle more bits, if desired. Of course, the number of quantizers connected in series is open to choice and may be suitably selected in accordance with the number of bits of desired digital data. Further, the differential amplifiers 23 and 24, which are operational amplifiers in the illustrative embodiments, may be replaced with a high input impedance type of amplifiers by way of example.

The analog switches 26 and 27 are shown and described as being transfer gates using MOS transistors. However, any other suitable types of analog switch may be used so long that they are capable of selectively turning on and off analog voltages. The circuitry of the controller 40 shown in FIG. 5 is only illustrative.

The first-stage quantizer, e.g., the quantizer $20_8$, of FIG. 1 may not be adapted to receive digital data from a preceding stage of quantizer, which does not exist, so that the ENOR gate 28 maybe omitted. Also, the last-stage quantizer may not need the differential amplifiers 23 and 24 or the analog switches 26 and 27 because it does not have to output an analog voltage.

In summary, it will be seen that the present invention provides an AD converter capable of reducing a delay and errors in AD conversion. Further,the circuit of the present invention is capable of performing pipeline processing and therefore increasing a conversion rate in the event of continuous AD conversion.

The entire disclosure of Japanese patent application No. 2001-138305 filed on May 9, 2001, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. In an analog-to-digital conversion circuit comprising a series of quantizers interconnected in cascade for converting an analog voltage to target digital data corresponding to the analog voltage, each of said quantizers comprising:

a comparator for receiving a first analog voltage and comparing the first analog voltage with a reference voltage to output a result of comparison;

a first amplifier for amplifying a difference voltage representative of a difference of the first analog voltage from the reference voltage to output a first output voltage;

a second amplifier for inverting the difference voltage to produce an inverted difference voltage and amplifying the inverted voltage to output a second output voltage;

a switch circuit connected to said first and second amplifiers for selecting either one of the first and second output voltages in response to the result of comparison to form a second analog signal, the second analog voltage being fed to following one of said quantizers as the first analog voltage; and a data output circuit for receiving first digital data from preceding one of said quantizers and producing second digital data in accordance with the first digital data and the result of comparison, the second digital data being fed as the first digital data to said following quantizer and forming part of the target digital data.

2. The conversion circuit in accordance with claim 1, wherein each of said quantizers has a latch circuit connected to said output circuit for receiving and latching the first digital data from said preceding quantizer in synchronism with a clock signal to feed said output circuit with the first digital data.

3. The conversion circuit in accordance with claim 1, wherein each of said quantizers has a sample and hold circuit connected to said comparator for receiving and holding the first analog voltage from said preceding quantizer in synchronism with a clock signal to feed said comparator with the first analog voltage.

4. The conversion circuit in accordance with claim 1, wherein said first and second amplifiers double the difference voltage.

5. The conversion circuit in accordance with claim 1, wherein said output circuit comprises an exclusive NOR gate having one input port for receiving the first digital data and another input port for receiving the result of comparison to produce the second digital data.

6. The conversion circuit in accordance with claim 1, wherein said switch comprises first and second MOS (Metal-Oxide Semiconductor) transfer gate transistors having a control gate electrode connected to receive the result of comparison complimentarily to each other.

7. The conversion circuit in accordance with claim 1, wherein said first amplifier comprises a first differential amplifier having an inverting input connected to the reference voltage and a non-inverting input connected to receive the first digital data, said second amplifier comprising a second differential amplifier having a non-inverting input connected to the reference voltage and an inverting input connected to receive the first digital data.

8. The conversion circuit in accordance with claim 1, wherein the part of the target digital data forms a bit of the target digital data.

9. An analog-to-digital conversion circuit comprising a series of quantizers interconnected in cascade for converting an analog voltage to bits of target digital data corresponding to the analog voltage, each of said quantizers comprising:

a comparator for receiving a first analog voltage and comparing the first analog voltage with a reference voltage to output a result of comparison;

a first differential amplifier for producing a difference voltage associated with a difference of the first analog voltage from the reference voltage and amplify the difference voltage to output a first output voltage;

a second differential amplifier for producing the difference voltage with a polarity of the difference voltage inverted to produce an inverted difference voltage and amplifying the inverted difference voltage to output a second output voltage;

a switch circuit connected to said first and second differential amplifiers for selecting either one of the first and second output voltages in response to the result of comparison to form a second analog signal, the second analog voltage being fed to following one of said quantizers as the first analog voltage; and an exclusive NOR gate for receiving first digital data from preceding one of said quantizers and producing second digital data in response to the first digital data and the result of comparison, the second digital data being fed as the first digital data to said following quantizer and forming one of the bits of the target digital data.

10. The conversion circuit in accordance with claim 9, wherein each of said quantizers has a latch circuit connected to an input to said exclusive NOR gate for receiving and latching the first digital data from said preceding quantizer in timed with a clock signal to feed the input to said exclusive NOR gate with the first digital data.

11. The conversion circuit in accordance with claim 9, wherein each of said quantizers has a sample and hold circuit connected to one input to said comparator for receiving and holding the first analog voltage from said preceding quantizer in timed with a clock signal to feed one input to said comparator with the first analog voltage.

12. The conversion circuit in accordance with claim 9, wherein said first and second differential amplifiers double the difference voltage.

13. The conversion circuit in accordance with claim 9, wherein said exclusive NOR gate has one input port for receiving the first digital data and another input port for receiving the result of comparison to produce the second digital data.

14. The conversion circuit in accordance with claim 9, wherein said switch comprises first and second MOS (Metal-Oxide Semiconductor) transfer gate transistors having a control gate electrode connected to receive the result of comparison complimentarily to each other.

15. The conversion circuit in accordance with claim 9, wherein said first differential amplifier has an inverting input connected to the reference voltage and a non-inverting input connected to receive the first digital data, said second differential amplifier having a non-inverting input connected to the reference voltage and an inverting input connected to receive the first digital data.

* * * * *